United States Patent [19]

Sun et al.

[11] Patent Number: 5,569,398
[45] Date of Patent: *Oct. 29, 1996

[54] LASER SYSTEM AND METHOD FOR SELECTIVELY TRIMMING FILMS

[75] Inventors: Yunlong Sun; Ed Swenson, both of Portland, Oreg.

[73] Assignee: Electro Scientific Industries, Inc., Portland, Oreg.

[*] Notice: The term of this patent shall not extend beyond the expiration date of Pat. No. 5,265,114.

[21] Appl. No.: 343,779

[22] Filed: Nov. 22, 1994

Related U.S. Application Data

[63] Continuation-in-part of PCT/08484 filed Sep. 10, 1993, which is a continuation-in-part of Ser. No. 943,875, Sep. 10, 1992, Pat. No. 5,265,114.

[51] Int. Cl.$^6$ ........................................ B23K 26/00
[52] U.S. Cl. ........................ 219/121.68; 219/121.69; 437/173
[58] Field of Search ........................ 219/121.68, 121.69, 219/121.61, 121.62; 437/19, 173; 156/643.1; 216/65

[56] References Cited

U.S. PATENT DOCUMENTS

| | | | |
|---|---|---|---|
| 4,182,024 | 1/1980 | Cometta | 219/121.68 |
| 4,288,776 | 9/1981 | Holmes | 219/121.68 |
| 4,399,345 | 8/1983 | Lapham et al. | 219/121.69 |
| 4,705,698 | 11/1987 | Van Dine | 219/121.69 |
| 4,708,747 | 11/1987 | O'Mara, Jr. | 437/19 |
| 4,792,779 | 12/1988 | Pond et al. | 219/121.69 |
| 4,970,369 | 11/1990 | Yamazaki et al. | 219/121.69 |
| 5,057,664 | 11/1991 | Johnson et al. | 219/121.69 |
| 5,096,850 | 3/1992 | Lippit, III | 437/173 |
| 5,296,674 | 3/1994 | Praschek et al. | 219/121.69 |
| 5,420,515 | 5/1995 | Uhling et al. | 324/601 |

OTHER PUBLICATIONS

Michael J. Mueller, "Functional laser trimming of thin film resistors on silicon ICs", SPIE, vol. 611, Laser Processing of Semiconductors and Hybrids (1986), pp. 70–83.
SPIE, vol. 611, Laser Processing of Semiconductors and Hybrids (1986), pp. 12–13.

*Primary Examiner*—Geoffrey S. Evans
*Attorney, Agent, or Firm*—Stoel Rives LLP

[57] ABSTRACT

A laser system and processing method exploits the absorption contrast between the materials from which a film and an underlying substrate (26) are made to effectively remove the film from the substrate. Laser output in a wavelength range of 1.2 to 3 μm optimizes the absorption contrast between many resistive or conductive film materials (e.g., metals, metal alloys, polysilicon, polycides, or disilicides) and integrated circuit substrates (e.g., silicon, gallium arsenide, or other semi-conductors) and permits the use of laser output in a wider range of energy or power levels and pulse widths, without risking damage to the substrates or adjacent circuit structures. Existing film processing laser systems can be readily modified to operate in the 1.2 to 3 μm range. The laser system and processing method also exploit a wavelength range in which devices, including any semiconductor material-based devices affected by conventional laser wavelengths and devices having light-sensitive or photo-electronic portions integrated into their circuits, can be effectively functionally trimmed without inducing malfunctions or function shifts in the processed devices, thus allowing faster functional laser processing, easing geometric restrictions on circuit design, and facilitating production of denser and smaller devices.

24 Claims, 5 Drawing Sheets

LASER SYSTEM AND METHOD FOR SELECTIVELY TRIMMING FILMS

This is a continuation-in-part of International patent application Ser. No. PCT/US93/08484, filed Sep. 10, 1993, which is a continuation-in-part of U.S. patent application Ser. No. 07/943,875, filed Sep. 10, 1992, now U.S. Pat. No. 5,265,114, issued Nov. 23, 1993.

TECHNICAL FIELD

The present invention relates to laser systems and methods for selectively processing a material of a single or multiple layer structure of a multimaterial, multilayer device and, in particular, to laser systems and processing methods that employ an output within a wavelength range that facilitates selective removal of a capacitive or resistive film structure on an integrated circuit substrate, such as silicon, gallium arsenide, or other semiconductor materials, and that facilitates functional laser processing of active or dedicated devices that are sensitive to certain wavelengths of light.

BACKGROUND OF THE INVENTION

Conventional laser systems are typically employed for processing target structures such as electrically conductive or resistive films in integrated circuits on silicon wafers. Trimming film capacitors, inductors, or resistors, which is presented herein only by way of example of selective material processing, may include total or partial removal or vaporization of the film material. Examples of resistive film trimming and functional device trimming laser systems include Model Nos. 4200, 4400, and 6100, manufactured by Electro Scientific Industries, Inc., which is the assignee of the present application. These systems typically utilize output wavelengths of 1.064 µm, 1.047 µm, and 0.532 µm.

FIG. 1A is a plan view of a portion of integrated circuit 10 depicting resistors 12a and 12b (generally, resistor 12) having a patterned resistor path 14 between metal contacts 16. The resistive value of a resistor 12 is largely a function of the pattern geometry, the path length between contacts 16, and the thickness of material composing resistor 12.

"L-cut" 15 on resistor 12a depicts a typical laser trim. In an L-cut 15, a first strip of resistive material is removed in a direction perpendicular to a line between the contacts to make a course adjustment to the resistance value. Then an adjoining second strip, perpendicular to the first strip, may be removed to make a finer adjustment to the resistance value. "Serpentine cut" 17 on resistor 12b depicts another common type or laster trim. In a serpentine cut, resistor material is removed along lines 18 to increase the length of path 14. Lines 18 are added until a desired resistive value is reached.

FIG. 1B is a cross-sectional side elevation view depicting a conventional output energy distribution of a laser output or pulse 20 directed at a resistive film structure 22 such as resistor 12. With reference to FIGS. 1A and 1B, resistive film structures 22 typically comprise a thin film layer 24 of a resistive material such as nichrome, tantalum nitride, cesium silicide, or silicon chromide, that is layered upon (or embedded within) a substrate 26 such as silicon, gallium arsenide, or other semiconductor materials. Alternatively, thin film layer 24 may be applied to an epitaxial or junction layer 28, such as an oxide of substrate 26. Thin film layer 24 may be covered by a protective layer 30, such as a dielectric, either due to an IC processing requirement or to contain laser trimming by-products or slag from splattering other integrated circuit elements. Integrated circuit 10 and resistive film structure 22 may also be composed of several materials including those required for anti-reflective coating, binding, or other manufacturing purposes.

If the film is a conductive film and part of an electrode of a capacitor device, the effective area of the film can be changed by punching holes in or trimming the film to reduce the capacitance of the film until it reaches a predetermined capacitance value.

The process of trimming conductive or resistive films to provide integrated circuit elements having predetermined capacitive or resistance values without powering up or operating the circuit is commonly referred to as "passive trimming." This process may involve measuring the circuit element during or following each trimming operation and to cease trimming when the predetermined value is obtained.

With reference to FIG. 1B, resistive film trimming may be performed with a conventional laser system. Laser pulse 20 is focused to a spot of radius R (which is, for example, about 2 to 5 µm) and applied in a predetermined path 14 across resistive structure 22 and has a suitable duration or pulse width and sufficient energy at a conventional wavelength to vaporize thin film layer 24. Laser pulse 20 must, however, be tailored to limit energy so as not to cause damage to substrate 26 or adjacent circuit structures either by direct laser energy absorption, by residual pulse energy coupled into substrate 26 below film layer 24 after it is vaporized, or by thermal conduction.

Simply decreasing the laser output power level often results in inadequate film vaporization and unclean kerfs or trims, exhibiting striations or poorly defined edges, that may increase the noise characteristics or jeopardize the stability of an integrated circuit.

Various laser pulse widths, repetition rates, and scanning speeds have been tested to optimize the trimming results for different film structures and materials and have achieved a certain level of success.

"Functional" laser processing or trimming of components in active or dedicated devices is yet another example of selective material processing. Such devices may, for example, be totally silicon wafer-based devices or hybrid integrated circuits (HIC) including some silicon wafer-based devices. In functional trimming, the device is powered up and then its performance is evaluated. Then, certain component(s), such as capacitors, resistors, or inductors, of the device are trimmed. Evaluation of the device function and trimming of the device components are repeated incrementally until the device performs to specification. Functional trimming is described in detail by R. H. Wagner, "Functional Laser Trimming: An Overview," *Proceedings of SPIE*, Vol. 611, Jan. 1986, at 12–13, and M. J. Mueller and W. Mickanin, "Functional Laser Trimming of Thin Film Resistors on Silicon ICs," *Proceedings of SPIE*, Vol. 611, Jan. 1986, at 70–83.

Functional trimming with conventional laser outputs such as 1.064 µm, 1.047 µm, or their harmonics presents an additional problem to that associated with passive trimming. These laser wavelengths tend to cause opto-electric responses such as generation of excessive carriers (electron-hole pairs) in the semiconductor substrate material which can affect the device and may result in performance drift or complete malfunction of the device or circuit. Furthermore, scattered laser light may impinge on adjacent active devices (such as P-N junctions or field effect transistors (FETs) or any semiconductor material based structures) and affect their performance due to excitation of carriers in the structure, resulting in performance drift or malfunction of the device or circuit during active trimming.

Thus, functional laser processing with these wavelengths is impossible or prohibitively slow because extra time is required to let these carriers disappear before the device or circuit will function normally. This is also true for integrated circuit (IC) or hybrid integrated circuit (HIC) devices having photo-receptive or light-sensitive portions or photo-electronic components such as photodiode or charge-coupled device (CCD) arrays integrated as part of the devices' function logic. During laser processing with conventional laser wavelengths, semiconductor substrate materials, semiconductor materials-based structures such as P-N junctions or FETs, as well as photo-receptive, light-sensitive or photo-electronic components or portions would react to the laser energy, causing the entire device to malfunction, regardless of their proximity to the laser beam. Functional laser processing or trimming of such devices, where the processing control is based upon measurement values obtained during real-time function of the device, is impossible or extremely slow to perform because of laser-induced malfunctions of the devices when using conventional laser processing wavelengths.

SUMMARY OF THE INVENTION

An object of the present invention is, therefore, to provide a laser system and method for cleanly processing integrated circuit film structures without damaging or affecting adjacent circuit structures or the underlying or surrounding substrate on which the structures are fabricated.

Another object of this invention is to provide such a system and method that employ selected laser output parameters to exploit the differential optical absorption between substrates and the film structures in order to reduce or eliminate damage sustained by the substrate from residual laser output coupled into the substrate after the film structure has been vaporized or processed.

A further object of this invention is to provide such a system and method that utilize a larger processing window, i.e., that accept a greater variation in device construction, and/or allow a greater variation in laser output power and energy levels, pulse widths, and pulse repetition frequencies to accurately process film structures.

Still another object of the invention is to facilitate functional trimming active or dedicated devices, reduce or negate settling time during functional trimming, and/or to ease circuit design restrictions for devices requiring functional trimming.

Yet another object of this invention is to provide such a system and method that can be relatively inexpensive to retrofit into existing film processing laser systems.

The present invention exploits the differential absorption (also referred to as absorptance or absorption contrast) between film material and the underlying substrate. The system and method of the present invention provide a laser output beam in a nonconventional range of wavelengths for film processing. The output beam optimizes absorption contrast between, for example, silicon or gallium arsenide and film structure materials including metals, metal alloys, or doped polysilicon or polysilicon-like semiconductors, and results in relatively efficient film processing (cutting or vaporizing) with little risk of damage to the surrounding and underlying substrate material. In particular, silicon substrates are only slightly affected by laser wavelengths in the 1.2 to 3 µm range (about 1 to 3 µm for gallium arsenide and about 1.8 to 3 µm for germanium), while aluminum, nickel, tungsten, platinum, and gold, as well as other metals, metal alloys such as nickel chromide, metal nitrides such as titanium nitride or tantalum nitride, cesium silicide, and polysilicon-like materials such as polycides or disilicides absorb relatively well at these wavelengths.

Conventional laser systems and methods for processing film structures 22 have emphasized the laser power absorption and temperature distribution properties of film layers 24, whereas the present invention considers the optical transmission/absorption properties of substrate 26 as well. Because the present invention exploits the differential absorption behavior of film layers 24 and substrate 26, the attention to laser pulse shaping can be relaxed and a pulse 20 of greater peak power and shorter duration can be used without risking damage to substrate 26. Such laser output parameters facilitate generation of cleaner kerfs and increased device stability.

Existing film processing laser systems can be relatively inexpensive to modify to generate output in the 1.2 to 3.0 µm wavelength range. Laser devices that produce laser output within this wavelength range can be adapted for film processing, although they are conventionally employed in fiber optic communications, medical applications, military range finding, and atmospheric pollution monitoring. Such laser systems have not been used for general material processing because they are more complex and typically deliver laser output of significantly lower power or energy per pulse than, for example, a 1.064 µm Nd:YAG or a 1.047 µm Nd:YLF laser. The conventional wisdom in laser material processing is to increase processing speed by maximizing laser output average or peak power while maintaining beam quality. This reinforces the avoidance of using wavelengths that do not optimize output power. In contradistinction to the conventional wisdom, the present invention employs a laser output having a wavelength window that maximizes absorption contrast for selective material processing, even though the peak power of such laser output may be lower than that which is available for conventional wavelengths.

Another advantage of the selective material processing achieved by the present invention is that it facilitates the functional laser processing or trimming of semiconductor material based structures, as well as photo-receptive, light-sensitive, or photo-electronic components. For example, employing laser output having a wavelength greater than 1.2 µm to functionally process silicon-, gallium arsenide-, and other semiconductor substrate-based devices substantially eliminates the undesirable laser-induced function shift or malfunction of the devices because these semiconductor-based structures and substrate materials and photo-receptive, light-sensitive, and photo-electronic components are virtually "blind" to wavelengths greater than 1.2 µm.

Nondoped or lightly doped silicon substrates are almost transparent at wavelengths greater than 1.2 µm and do not generate an excessive amount of carriers when exposed to a laser beam having such a wavelength. As a consequence, virtually no settling time is required and the functional performance measurements of these devices can be achieved almost concurrently.

Additional objects and advantages of the invention will be apparent from the following detailed description of a preferred embodiment thereof, which proceeds with reference to the accompanying drawings.

DETAILED DESCRIPTION OF THE PREFERRED EMBODIMENTS

Figure 1A:
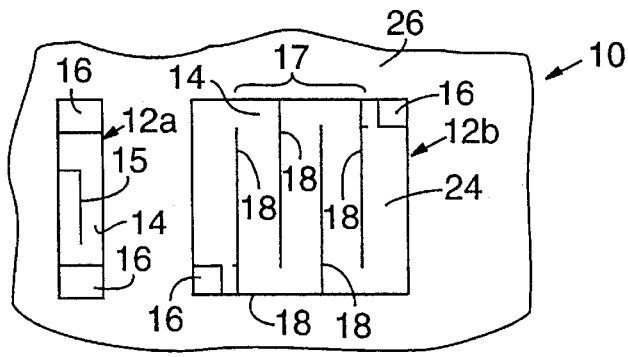
FIG. 1A is a plan view of a portion of an integrated circuit depicting resistors having a resistive film path between metal contacts.
Figure 1B:
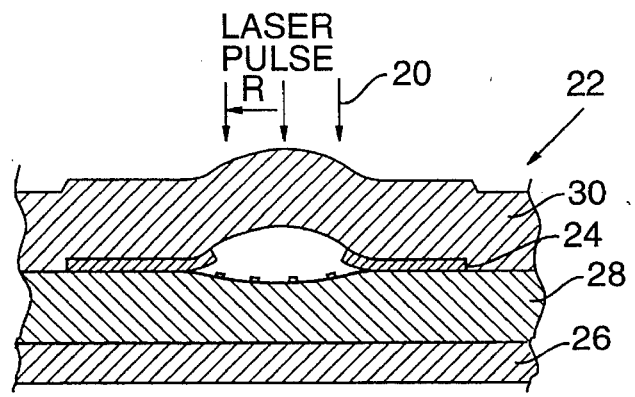
FIG. 1B is a fragmentary cross-sectional side view of a conventional semiconductor film structure receiving a laser pulse characterized by a particular energy distribution.
Figure 2:
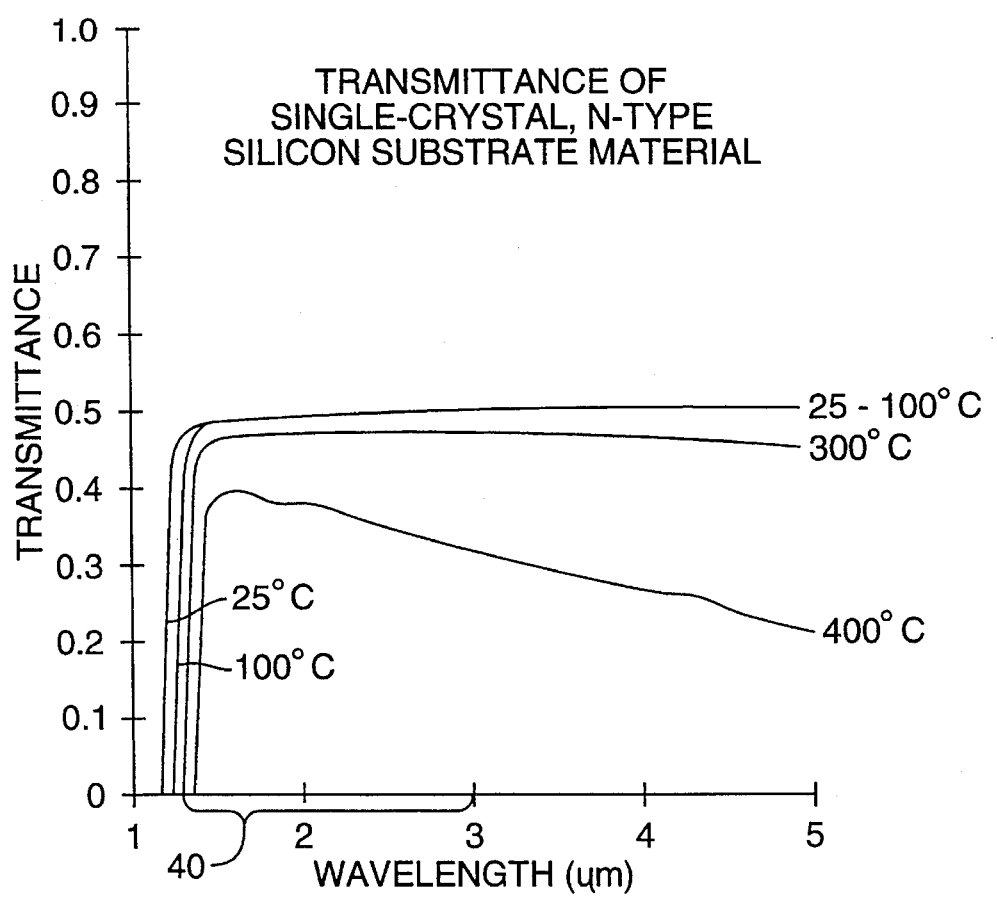
FIG. 2 shows graphical representations of optical transmission properties of silicon versus wavelength for various silicon temperatures.

FIG. 2 graphically shows the optical transmittance properties of silicon versus wavelength for various silicon temperatures. FIG. 2 is an enlarged replication of a portion of FIG. 6e-52 from D. T. Gillespie et al., Appl. Opt., Vol. 4, 1965, at 1488. FIG. 2 reveals that at a temperature between 25° C. and 300° C. a 2.80 mm thick, single-crystal, N-type silicon transmits nearly fifty percent of laser output in the 1.12 to 4.5 μm wavelength range. The transmittance of this type of silicon sharply decreases as the wavelength output drops below 1.12 μm.

Figure 3:
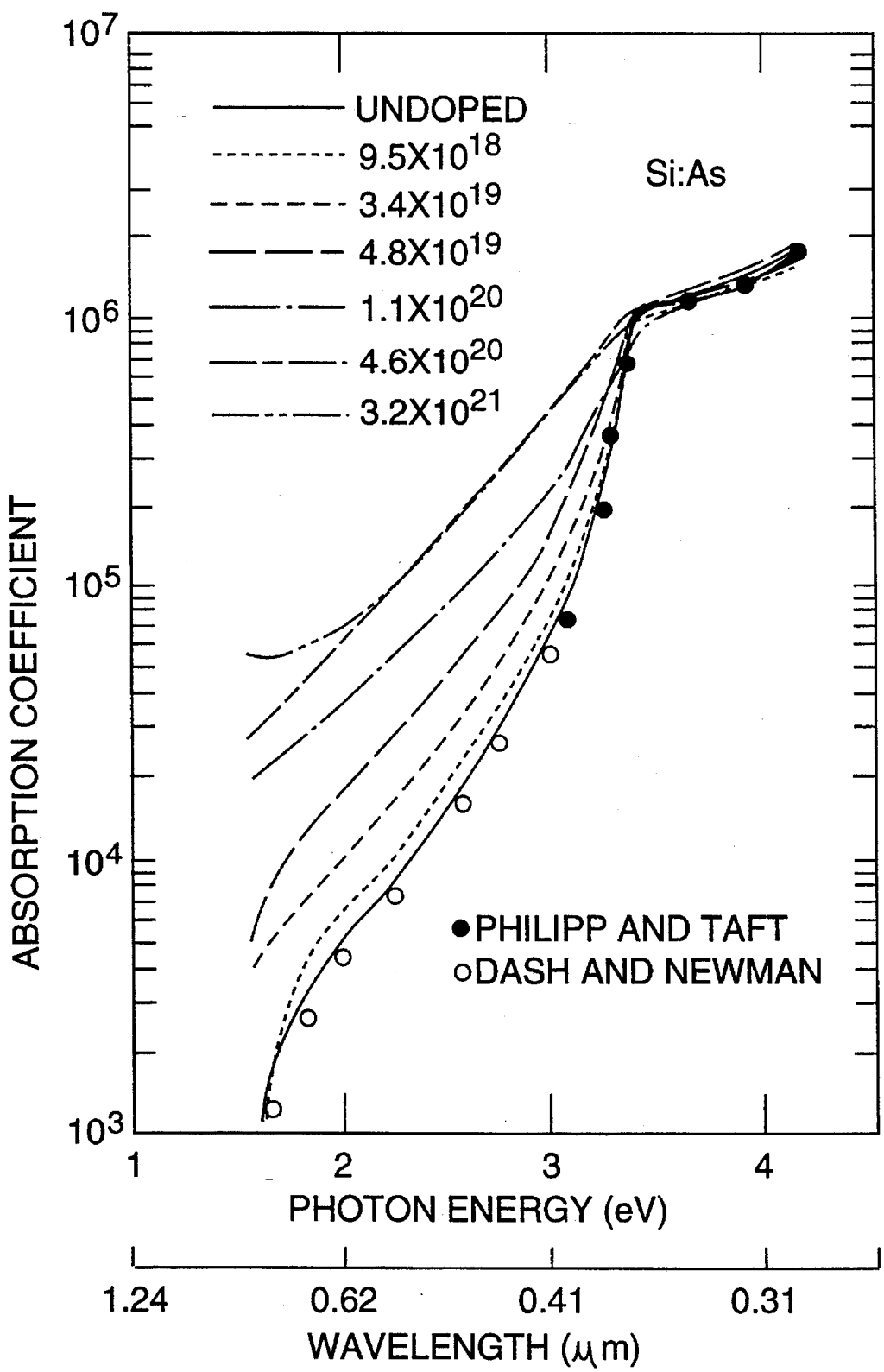
FIG. 3 shows graphical representations of the optical absorption coefficient versus laser photon energy (wavelength) for several arsenide concentrations in silicon.

FIG. 3 graphically shows the optical absorption coefficient versus laser photon energy (wavelength) for several arsenide concentrations in silicon. FIG. 3 is a replication of a figure from Jellison et al., *Phys. Rev. Let.*, Vol. 46, 1981, at 1414. FIG. 3 reveals that undoped and lightly doped silicon exhibits a sharp drop of absorption coefficient at wavelengths longer than about 1 μm. As the arsenide doping (and conductivity) of silicon increases, the drop of absorption coefficient at wavelengths longer than 1 μm is dramatically reduced. Detailed physics of this behavior are described in "Pulsed Laser Processing of Semiconductors," *Semiconductors and Semimetals*, Vol. 23 (Academic Press, Inc., 1984).

Although a reliable publication of the optical absorption versus wavelength from 1 to 3 μm for doped polysilicon, polycide, and disilicide is not readily available, skilled persons might expect that the absorption coefficients for these doped materials would drop more gently from 1 to 3 μm than the absorption coefficient for undoped silicon because the doped materials have a higher conductivity and/or different material nature than undoped silicon.

Figure 4:
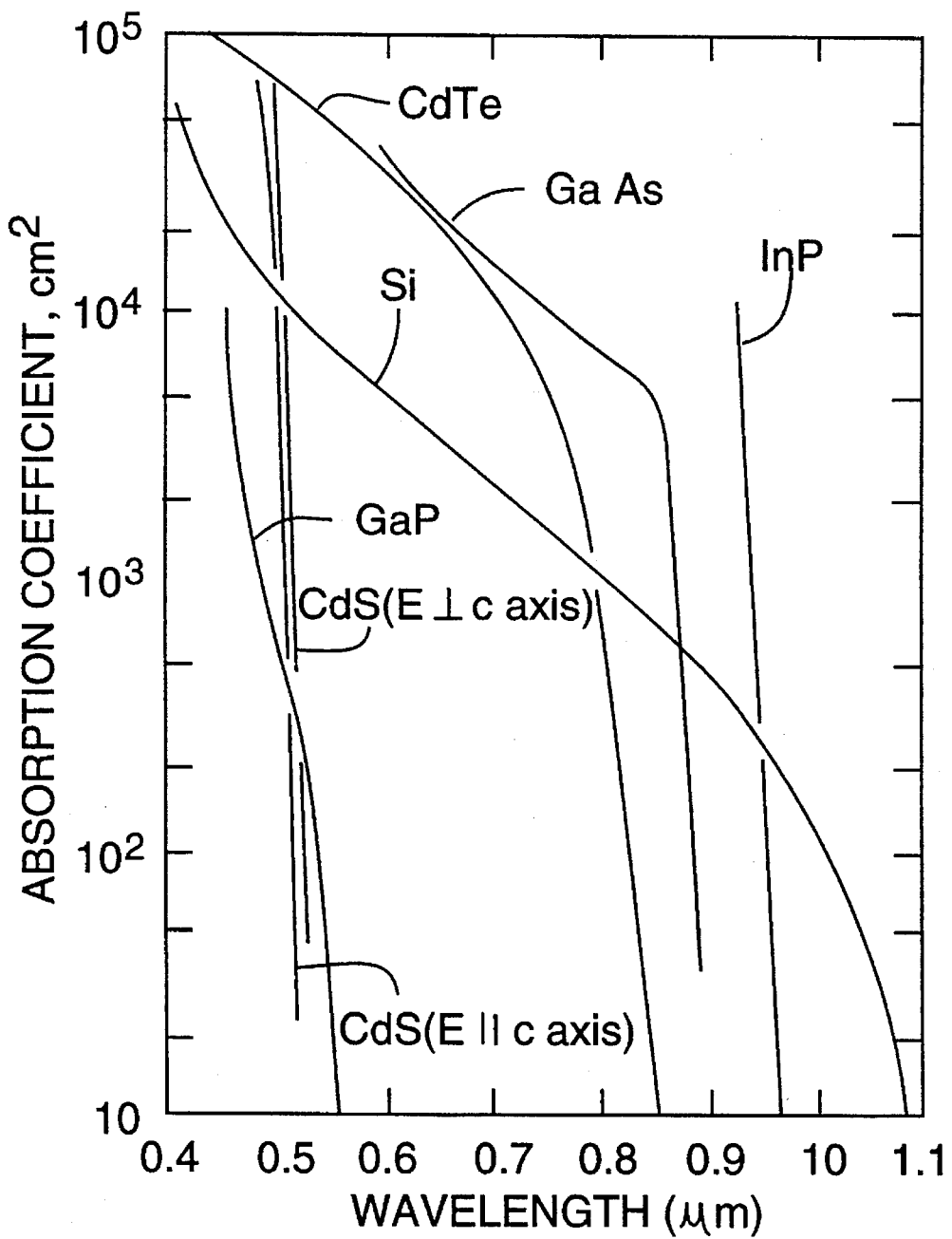
FIG. 4 shows graphical representations of the optical absorption properties versus wavelength for various semiconductors, including gallium arsenide, at room temperature.

FIG. 4 graphically shows the optical absorption coefficient versus wavelength for various semiconductors, including gallium arsenide, and silicon at room temperature (300° K.). FIG. 4 is a replication of FIG. 156 from "Handbook of Optics," Walter G. Driscoll ed., Optical Society of America (McGraw-Hill Book Co., 1978). The graph reveals that at room temperature, the optical absorption of silicon drops dramatically as wavelengths approach and exceed 1.1 μm. Similarly, the optical absorption of gallium arsenide drops significantly at wavelengths longer than about 0.9 μm (and substantially for wavelengths much longer than 0.9).

Figure 5:
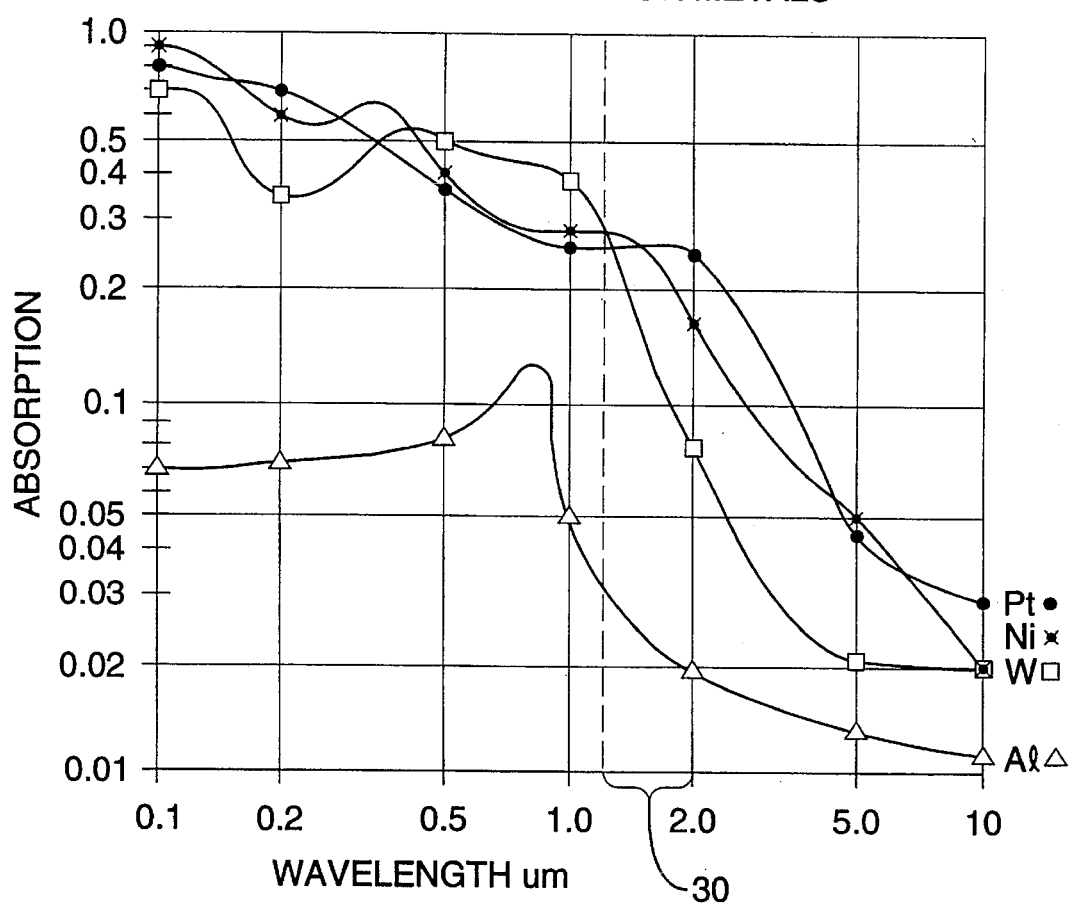
FIG. 5 shows graphical representations of the optical absorption properties of four different metals versus wavelength.
Figure 6:
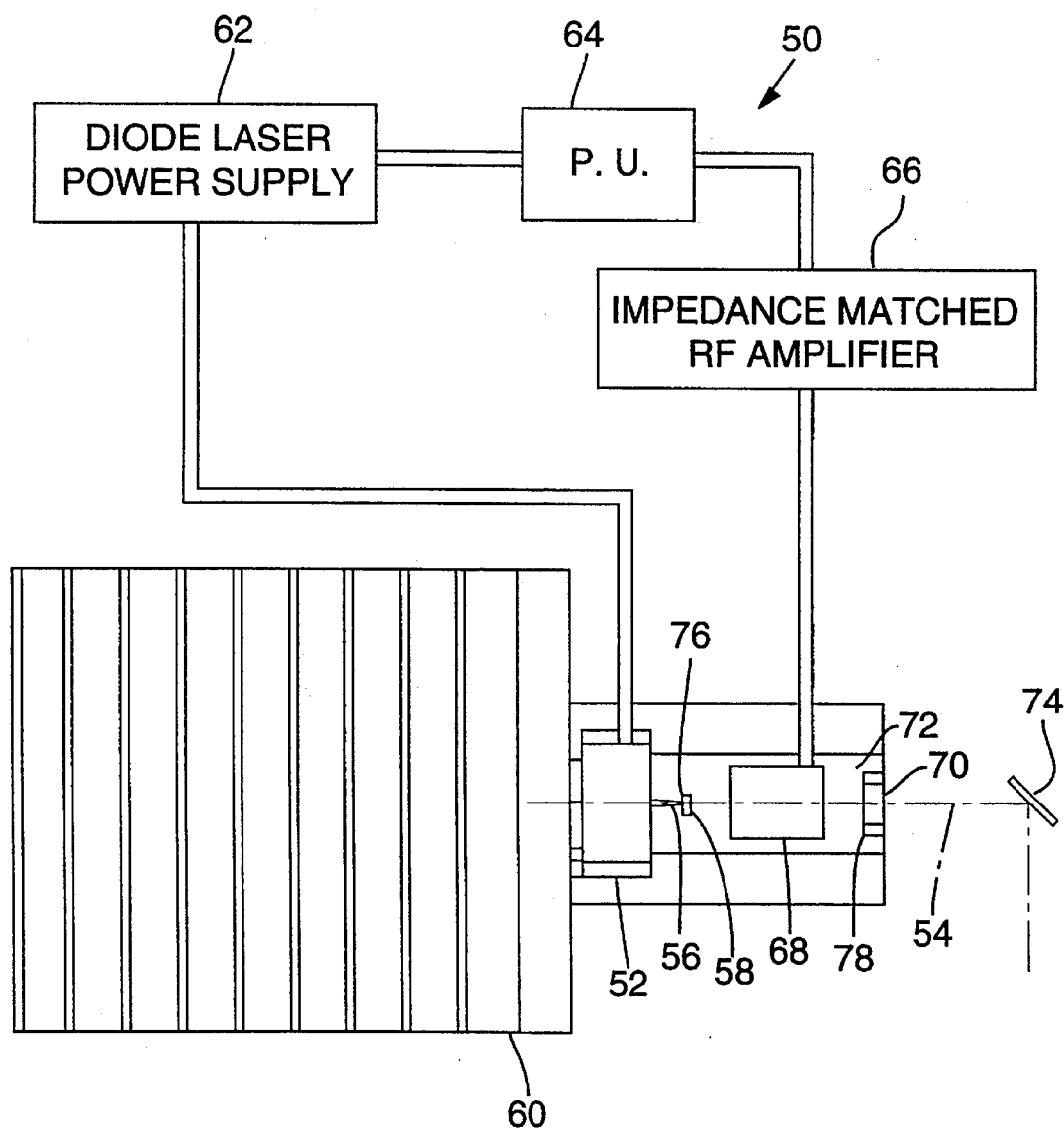
FIG. 6 is a plan view of a preferred embodiment of a laser system incorporating the present invention.

FIG. 5 graphically shows the optical absorptance properties of different metals such as aluminum, nickel, tungsten, and platinum that may be used as film layers 24. FIG. 5 is a compilation of the relevant portions of absorptance graphs found in "Handbook of Laser Science and Technology," *Volume IV Optical Materials: Part 2 By Marvin J. Weber* (CRC Press, 1986). FIG. 5 shows that metals, such as aluminum, nickel, tungsten, and platinum, absorb laser wavelengths ranging from below 0.1 to 3.0 μm, with aluminum absorptance being lower than that of the other metals. Metal nitrides (e.g., titanium nitride) and other high-conductivity, metal-like materials used to form film layers 24 generally have similar optical absorption characteristics. However, the absorption coefficients for such materials are not as readily available as are those for metals.

The graphs in FIGS. 2 through 5 reveal an overlap 40 of wavelengths ranging between about 1.2 to about 3 μm in which silicon and other substrates 26 are almost transparent and in which the optical absorption behavior of a variety of film structure materials, especially metals, is sufficient for them to be processed. When comparing the 1.2 to 3 μm wavelength range to conventional laser wavelengths of 1.064 μm, 1.047 μm, and 0,532 μm, skilled persons will note, for example, the optical transmittance of silicon increases by orders of magnitude while the optical absorptance of metal film materials, for example, decreases by a factor of about two. Skilled persons will also be able to identify preferred wavelength ranges for other substrate materials, such as about 1 to 3 μm for gallium arsenide, based on similar considerations.

The contrast between the absorptance, which is typically the inverse of transmittance, of substrate 26 and film structures allows utilization of a higher peak power or energy laser pulse 20 to cut or process film layers 24 without a proportional increase in risk of damaging substrate 26 or adjacent circuit structures.

While laser beams of shorter wavelengths within the 1.2 to 3 μm wavelength range can be focused to smaller diameters to maximize the energy coupled into film layers 24 along paths 14, wavelengths such as 1.32 μm and 1.34 μm are sufficiently long to minimize damage to substrate 26, as well as eliminate light-induced malfunctions of silicon-based active devices, and are preferred for most film processing operations. The choice of 1.32 μm or 1.34 μm is also somewhat predicated on laser source availability and other complexities familiar to those skilled in the art.

Wavelengths of 1.5 to 3 μm may preferably be used to process film structures for some applications where the substrate doping level is higher or the film structure is physically too close to the substrate, imposing a higher probability of temperature elevation of the substrate due to laser energy absorption or thermal conduction from the heated film structures.

In a preferred embodiment, a conventional diode-pumped, solid-state laser with a lasant crystal such as Nd:YAG, Nd:YLF, ND:YAP, or Nd:YVO$_4$ is configured to produce output in the 1.2 to 3.0 μm wavelength range. Each such laser design employs resonator mirrors with appropriate dichroic coatings to be highly transmissive to the most conventional wavelength of the lasant crystal but have desired reflectivity at a selected wavelength within the range 1.2 to 3 μm and preferably at 1.32 μm or 1.34 μm. Such dichroic coatings would suppress laser action at the most conventional wavelength of the lasant crystal, such as 1.06 μm for Nd:YAG, and enhance laser action at the selected wavelength, preferably 1.32 μm for Nd:YAG.

In another preferred embodiment, a diode-pumped or arc lamp-pumped solid-state laser having a lasant crystal of YAG doped with other dopants such as holmium (laser output at 2.1 μm) or erbium (2.94 μm), or codoped with chromium, thalium, and holmium (2.1 μm), could be employed to deliver laser output within the 1.2 to 3 μm wavelength range.

In still another preferred embodiment, nonlinear conversion schemes such as Raman shifting or optical parametric oscillation could be adapted to convert conventional laser wavelengths of about 1 μm into wavelengths in a range of 1.2 to 3 μm.

Preferably, all of the transmissive optics in a delivery path of the laser output beam are anti-reflection coated for the selected wavelength. In addition, photo-electric-based laser power or energy monitoring devices are changed to be responsive to the selected longer wavelength. Other minor optical modifications to compensate for changes in laser output focusing characteristics are preferred and known to those having skill in the art.

One skilled in the art will also recognize that pumping schemes, such as higher output power diode lasers or arc lamp-pumping, may be employed to compensate for the lower gain for lasant crystals such as Nd:YAG or Nd:YLF at 1.2 to 3 μm wavelengths. For example, with reference to an embodiment of a laser system 50 shown in FIG. 6, the output (preferably 3 watts or greater) of a high-power AlGaAs laser 52 may be funneled along optic axis 54 through a nonimaging concentrator 56 composed of a high-refractive index, crystalline dielectric material and then coupled into an Nd:YLF lasant crystal 58. This method is disclosed in U.S. Pat. No. 5,323,414 of Baird, DeFreez, and Sun for "Laser System and Method for Employing a Nonimaging Concentrator," which is assigned to the assignee of the present application.

Preferably, laser 52 is positioned against a heat sink 60 and is powered by a diode laser power supply 62 that is controlled by a processing unit 64. Processing unit 64 is also connected to an impedance-matched RF amplifier 66 and controls signals delivered to a transducer coupled to a Q-switch 68. Q-switch 68 is preferably positioned between lasant crystal 58 and an output coupler 70 within a resonator cavity 72. A targeting and focusing system 74 may be employed to direct laser output to a desired position on film structure 22 or other target material. Pumping, Q-switching, and targeting of laser system 50 of the preferred embodiment are accomplished through conventional techniques well-known to persons skilled in the art.

An input mirror coating 76 on lasant crystal 58 and an output mirror coating 78 on output coupler 70 are preferably highly transmissive at the conventional 1.047 μm YLF emission wavelength. In addition, input mirror coating 76 is transmissive to the AlGaAs emission wavelength range and reflective at about 1.32 μm, and coating 78 is partly transmissive at 1.32 μm to permit laser operation.

Skilled persons will appreciate that the above-described laser systems can also be employed at wavelengths longer than 1.2 μm to process or trim thin film structures, such as capacitors, resistors, inductors, microwave stubs, or other components, in active integrated circuit devices to desired performance or functional parameters. Laser output in the 1.2 to 3 μm range, for example, can effectively trim resistor material, such as nickel chromide, tantalum nitride, cesium silicide, disilicide, polycide, and other commonly used film materials, but does not substantially stimulate undesirable electron-hole pairs and photocurrents in any type of semiconductor material-based structures that might be affected by conventional laser wavelengths. As a consequence, virtually no settling time is required between laser trims and the functional measurements of the active devices, so the functional measurements can be achieved almost concurrently.

Skilled persons will appreciate that the significant absorption contrast between thin film layers 24 and the surrounding substrate 26 will allow use of much higher processing powers than could be used with conventional 1,047 μm or 1,064 μm laser wavelengths without causing damage to substrate 26, i.e, the energy of laser output 20 in excess of that used to process film layer 24 will not be absorbed by the underlying substrate 26 during and after the film structures have been processed. The higher power laser output at the longer wavelengths will facilitate cleaner trimming of resistive film layer 24.

Persons skilled in the art might expect that the level of hole-electron pairs created at the preferred high-intensity light level would induce metal-like characteristics in substrate 26, thereby adversely affecting the desired low absorption by substrate 26. Experiments have shown, however, that at processing laser power levels used, the absorptance of lightly doped substrates at 1.32 μm remains low.

Skilled persons will also appreciate that the preferred wavelengths would excite fewer electron-hole pair carriers to affect the performance of adjacent devices, so device design restrictions could be eased and circuit compaction could be increased to provide smaller devices or circuits.

Higher power laser output may also be advantageous because it can raise the temperature of film structure material more quickly and deliver enough energy to exceed the required latent heat of vaporization of the film material, therefore resulting in direct vaporization of most or all of the film structure material. This direct vaporization is preferred because it will reduce the chance of redeposition of the "removed" film structure material in its liquid phase back onto the surrounding area. On the other hand, if the laser power is curtailed in an attempt to prevent substrate damage (as with some conventional film processing laser systems), then the direct vaporization rate of the film structure material would be much lower. Such inefficient laser power may cause film structure material in the liquid state to be splashed away and redeposited on the surrounding area of substrate 26 as a conductive "slag," that may cause malfunction of the integrated circuit device.

It will be obvious to those having skill in the art that many changes may be made to the details of the above-described embodiments of this invention without departing from the underlying principles thereof. Accordingly, it will be appreciated that this invention is also applicable to laser-based operations for different semiconductor substrate and film materials, as well as laser-based operations outside the semiconductor industry, for selective removal of one or more materials from a multimaterial device. The scope of the present invention should, therefore, be determined only by the following claims.

We claim:

1. A method for laser trimming a multilayer, multimaterial structure that includes light sensitive target material and a substrate having respective first and second wavelength-sensitive light absorption characteristics, the first and second absorption characteristics provide a contrast in light absorption for different wavelengths of light, comprising:

generating laser output at a predetermined wavelength in a range of about 1.2 to 3 μm; and directing the laser output to illuminate the target material, the predetermined wavelength having a value that represents a sufficiently large absorption contrast between the target material and the substrate to change a physical property of the target material but leave substantially unchanged the physical property of the substrate.

2. The method of claim 1 in which the laser output has an energy that exceeds a processing threshold of the target material.

3. The method of claim 1 in which the substrate comprises silicon, gallium arsenide, or other semiconductor materials.

4. The method of claim 1 in which the target material is selected from aluminum, titanium, nickel, copper, tungsten, platinum, gold, nickel chromide, tantalum nitride, titanium nitride, cesium silicide, doped polysilicon, disilicide, or policide.

5. The method of claim 1 in which the laser output is generated by a Q-switched, diode-pumped or arc lamp-pumped, solid-state laser.

6. The method of claim 1 in which the structure forms part of a device comprising a silicon, gallium arsenide, or other semiconductor material substrate.

7. The method of claim 6 in which the device comprises semiconductor material based structures or circuitry.

8. The method of claim 7 in which the laser output has an energy that exceeds a processing threshold of the target material without generating excessive carriers within the structure or causing malfunction of semiconductor material based adjacent structures.

9. A laser system for selectively processing a film target structure of a multilayer, multimaterial device including a substrate, the target structure and substrate having wavelength-sensitive properties, comprising:

a pumping source; and a lasant positioned in a resonator cavity adapted to be pumped by the pumping source to provide a laser output in a wavelength range of about 1.2 to 3 µm, the laser output having a spatial spot size, power, and wavelength selected to exploit differences in the wavelength-sensitive properties of the target structure and the substrate such that the target structure within the spatial spot size is effectively processed and the substrate within the spatial spot size is relatively undamaged by the laser output.

10. The laser system of claim 9 in which the device comprises semiconductor material based circuitry and the wavelength of the laser output is in about the 1.2 to 3 µm range.

11. The laser system of claim 9 in which the substrate comprises silicon, gallium arsenide, or other semiconductors.

12. The laser system of claim 9 in which the laser beam energy is in excess of that which is required to process the structure without exciting excessive carriers in the substrate or causing malfunction of semiconductor material based portions.

13. The laser system of claim 9 in which the laser output has an energy that exceeds a processing threshold of the target material.

14. The laser system of claim 9 further comprising a Q-switched, diode-pumped or arc-lamp pumped, solid-state laser.

15. The laser system of claim 9 in which the lasant is selected from the group of Nd:YAG, Nd:YLF, Nd:YAP, and Nd:YVO$_4$ and in which the resonator cavity employs resonator mirrors that are highly transmissive to a conventional wavelength of the lasant but have desired reflectivity at a wavelength within a wavelength range of 1.2 to 3 µm.

16. The laser system of claim 9 in which the lasant comprises YAG doped with holmium or erbium, or codoped with chromium, thulium, and holmium, and the resonator cavity is adapted to generate laser output at a wavelength within a wavelength range of 1.2 to 3 µm.

17. A method for employing a laser system to process a film structure formed on a silicon, gallium arsenide, or other semiconductor substrate, comprising:

generating laser output in a wavelength range of about 1.2 to 3 µm; and directing the laser output at the film structure such that it is effectively processed but the substrate is relatively-undamaged.

18. The method of claim 17 in which the film structure comprises multiple layers and the laser output comprises energy that exceeds a processing threshold of the film structure.

19. The method of claim 17, further comprising:

activating the device prior to the step of directing; and testing the device to determine whether the structure requires an additional trim to satisfy a predetermined parameter of the device.

20. The method of claim 19 in which the steps of directing and testing are almost concurrent.

21. The method of claim 19 in which virtually no settling time is required between the steps of directing and testing.

22. The method of claim 19 in which the device includes adjacent structures having a semiconductor material based substrate or semiconductor material based elements that affect the parameter of the device.

23. The method of claim 19 in which the structure is repeatedly trimmed until it has a predetermined electronic value such that it satisfies the predetermined parameter of the device.

24. The method of claim 19 in which the structure is repeatedly trimmed until the device satisfies a predetermined function.

* * * * *